(12) United States Patent
Sasaki et al.

(10) Patent No.: US 7,364,438 B2
(45) Date of Patent: Apr. 29, 2008

(54) ELECTRICAL CONNECTION BOX

(75) Inventors: Yoshikazu Sasaki, Yokkaichi (JP); Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/510,569

(22) Filed: Aug. 28, 2006

(65) Prior Publication Data

US 2007/0076383 A1    Apr. 5, 2007

(30) Foreign Application Priority Data

Sep. 2, 2005    (JP)    ............... 2005-254642

(51) Int. Cl.
  *H01K 12/00*    (2006.01)
  *H05R 1/00*    (2006.01)
(52) U.S. Cl. .................... 439/76.1; 439/76.2; 439/949; 361/752
(58) Field of Classification Search ............... 439/76.1, 439/689, 76.2, 949; 174/52.1
See application file for complete search history.

(56) References Cited

U.S. PATENT DOCUMENTS

| | | | |
|---|---|---|---|
| 5,190,471 A * | 3/1993 | Barile et al. ................. | 439/455 |
| 5,759,050 A * | 6/1998 | Matsuoka et al. .......... | 439/76.2 |
| 6,368,119 B2 * | 4/2002 | Murakami .................. | 439/76.2 |
| 6,434,013 B2 * | 8/2002 | Kitamura et al. ........... | 361/752 |
| 6,551,144 B2 * | 4/2003 | Wellmann et al. .......... | 439/689 |
| 7,201,586 B2 * | 4/2007 | Kohlenberg et al. ....... | 439/76.2 |
| 2003/0137813 A1 | 7/2003 | Onizuka et al. | |
| 2006/0030173 A1 * | 2/2006 | Kawakita et al. .......... | 439/76.1 |
| 2006/0292904 A1 * | 12/2006 | Kanou ....................... | 439/76.2 |

FOREIGN PATENT DOCUMENTS

| JP | A 10-35375 | 2/1998 |
|---|---|---|
| JP | A 2003-164039 | 6/2003 |

* cited by examiner

*Primary Examiner*—Tuan T. Dinh
*Assistant Examiner*—Andargie Aychillhum
(74) *Attorney, Agent, or Firm*—Oliff & Berridge, PLC

(57) ABSTRACT

A case that houses a circuit component includes a frame along a peripheral edge of a circuit board, and a cover assembled to the frame so as to cover the circuit board, and connectors, facing an outer peripheral side of the frame are provided in the frame. In corresponding surfaces of the cover and each of the connectors, a first rib, a second rib, a first rib receiving groove, and a second rib receiving groove are formed that can regulate passage of a liquid in clearances between the connectors and the cover by fitting of protrusions and recesses. This prevents or limits a liquid outside the frame from entering the frame through the clearances between the connectors and the cover.

19 Claims, 3 Drawing Sheets

ELECTRICAL CONNECTION BOX

CROSS REFERENCE TO RELATED APPLICATION

This application claims priority from Japanese Patent Application No. 2005-254642 filed Sep. 2, 2005. The entire content of this priority application is incorporated herein by reference.

TECHNICAL FIELD

The present disclosure relates to an electrical connection box.

BACKGROUND

Some electrical connection boxes mounted in an automobile have a structure in which a circuit component is housed in a case. The circuit component includes a circuit board, a busbar arranged along a back surface of the circuit board, and a switching member such as a relay mounted to a front surface of the circuit board, and the busbar has a terminal portion formed by bending an end thereof into a substantially L shape. The case includes a frame placed along a peripheral edge of the circuit board and secured to the circuit board, and a cover assembled to the frame so as to cover the circuit board from the front surface. A connector housing is mounted to the frame so as to face an outer peripheral side of the frame, and the terminal portion of the busbar is housed in the connector housing. When a harness connector fits in the connector housing, a terminal of the harness connector is connected to the terminal portion of the busbar.

For the above described electrical connection box, water may enter the inside of the frame from outside through a clearance between the connector housing and the cover.

Thus there is a need in the art for an electrical connection box that prevents or limits liquid from entering through a clearance between a connector housing and a cover.

SUMMARY

The present invention provides an electrical connection box in which a circuit board is housed in a case having an opening portion, including a connector that has a connector housing, and is assembled to the case so that the connector housing is positioned in the opening portion, and fittable to a counterpart connector, a facing wall portion formed in an inner peripheral edge of the opening portion in the case so as to face an outer peripheral surface of the connector housing, a rib that protrudes from at least one of the outer peripheral surface of the connector housing and the facing wall portion of the case toward the other, and extends in a gap between the outer peripheral surface of the connector housing and the facing wall portion in a direction perpendicular to a fitting direction of the counterpart connector, and a rib receiving groove that is formed in the other of the outer peripheral surface of the connector housing and the facing wall portion, and receives the rib.

According to the above described configuration, even if a liquid such as water adheres to a clearance between the connector housing and the case, the rib and the rib receiving groove that receives the rib block an entering path of the liquid. This prevents or limits the liquid, such as water, from entering the case through a gap between the outer peripheral surface of the connector housing and the facing wall portion of the case.

BRIEF DESCRIPTION OF THE DRAWINGS

Illustrative aspects in accordance with the invention will be described in detail with reference to the following figures wherein.

DETAILED DESCRIPTION OF THE PRESENT INVENTION

Figure 1:
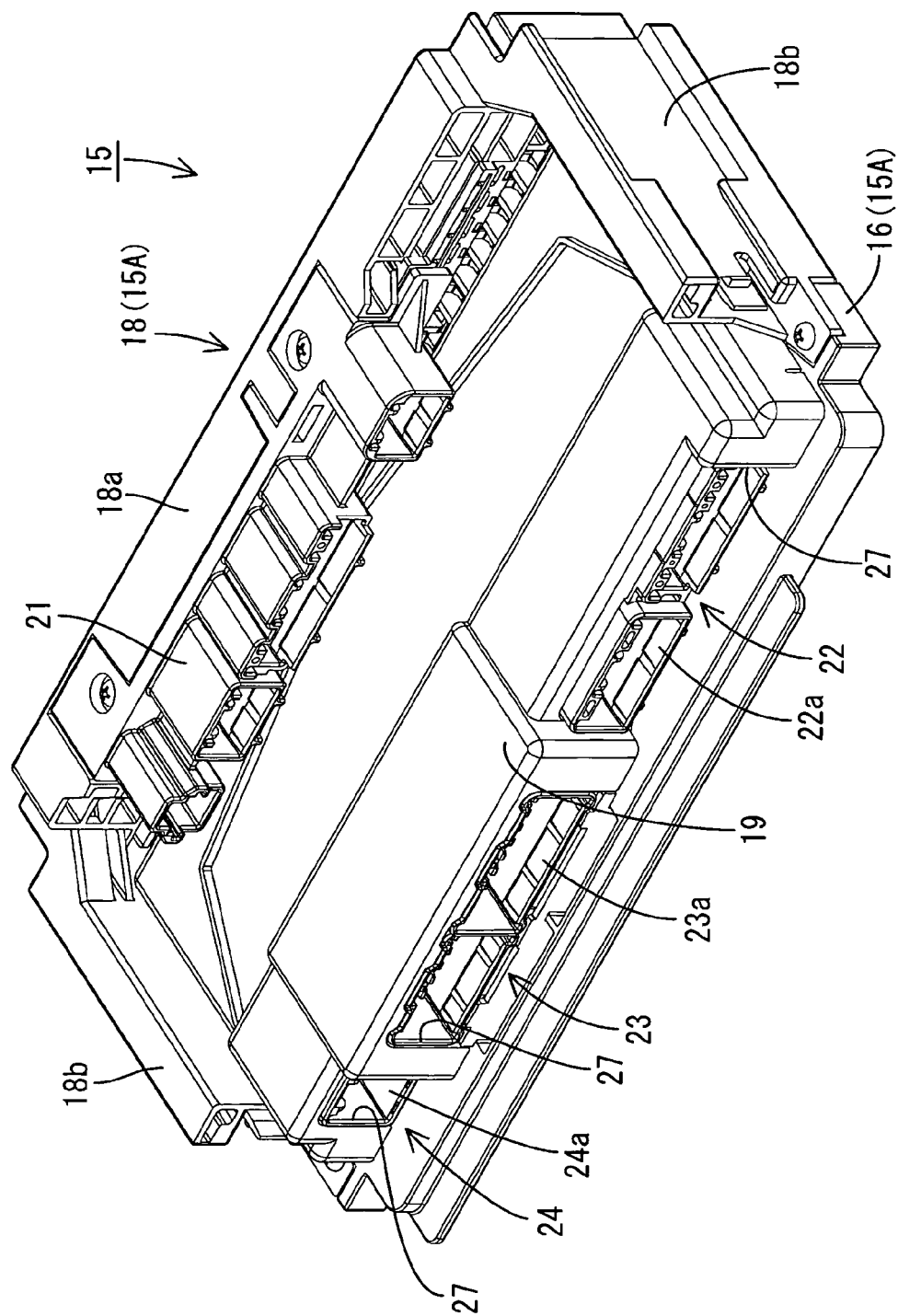
FIG. 1 is a perspective view of one aspect of the invention.
Figure 2:
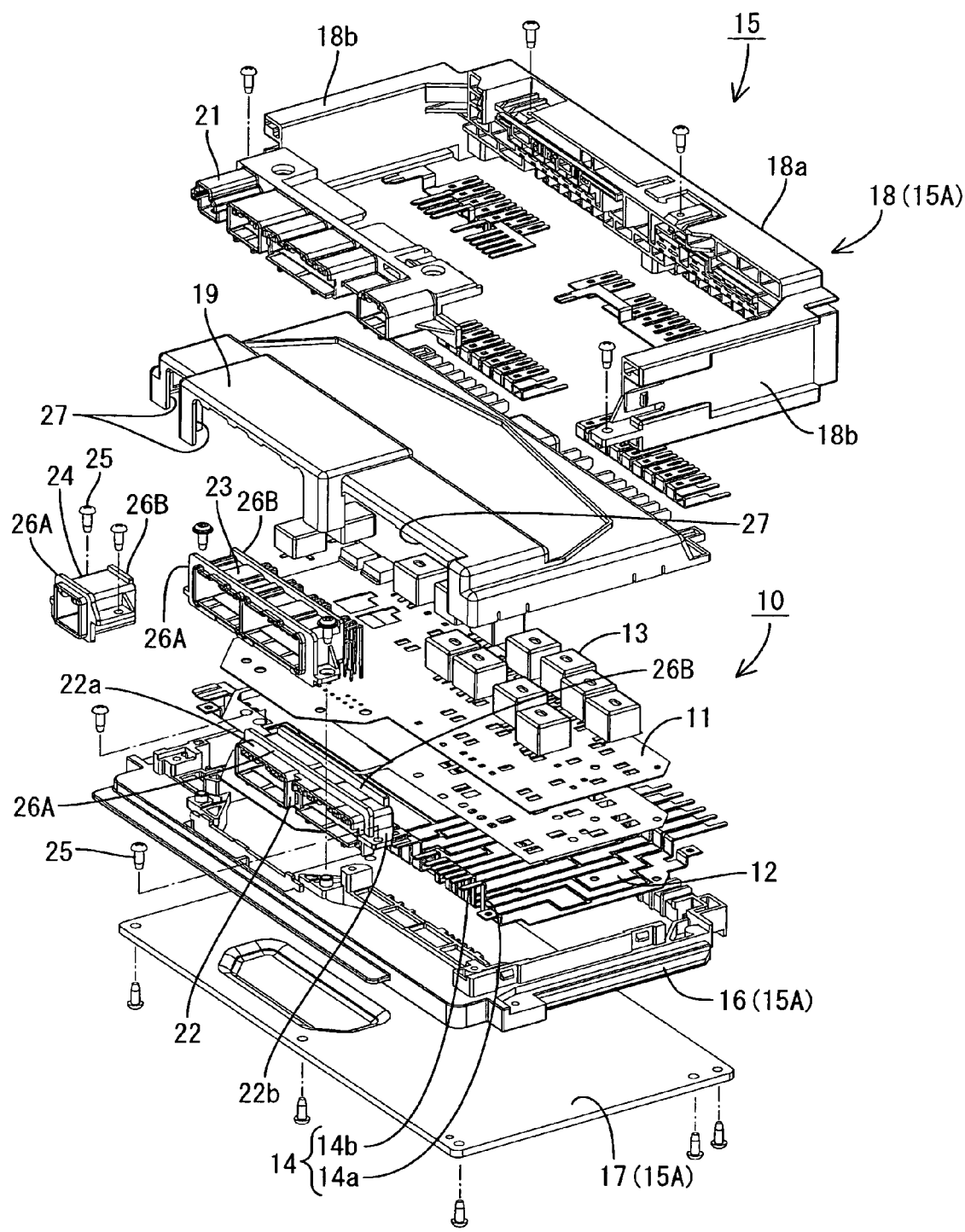
FIG. 2 is an exploded perspective view of one aspect of the invention.
Figure 3:
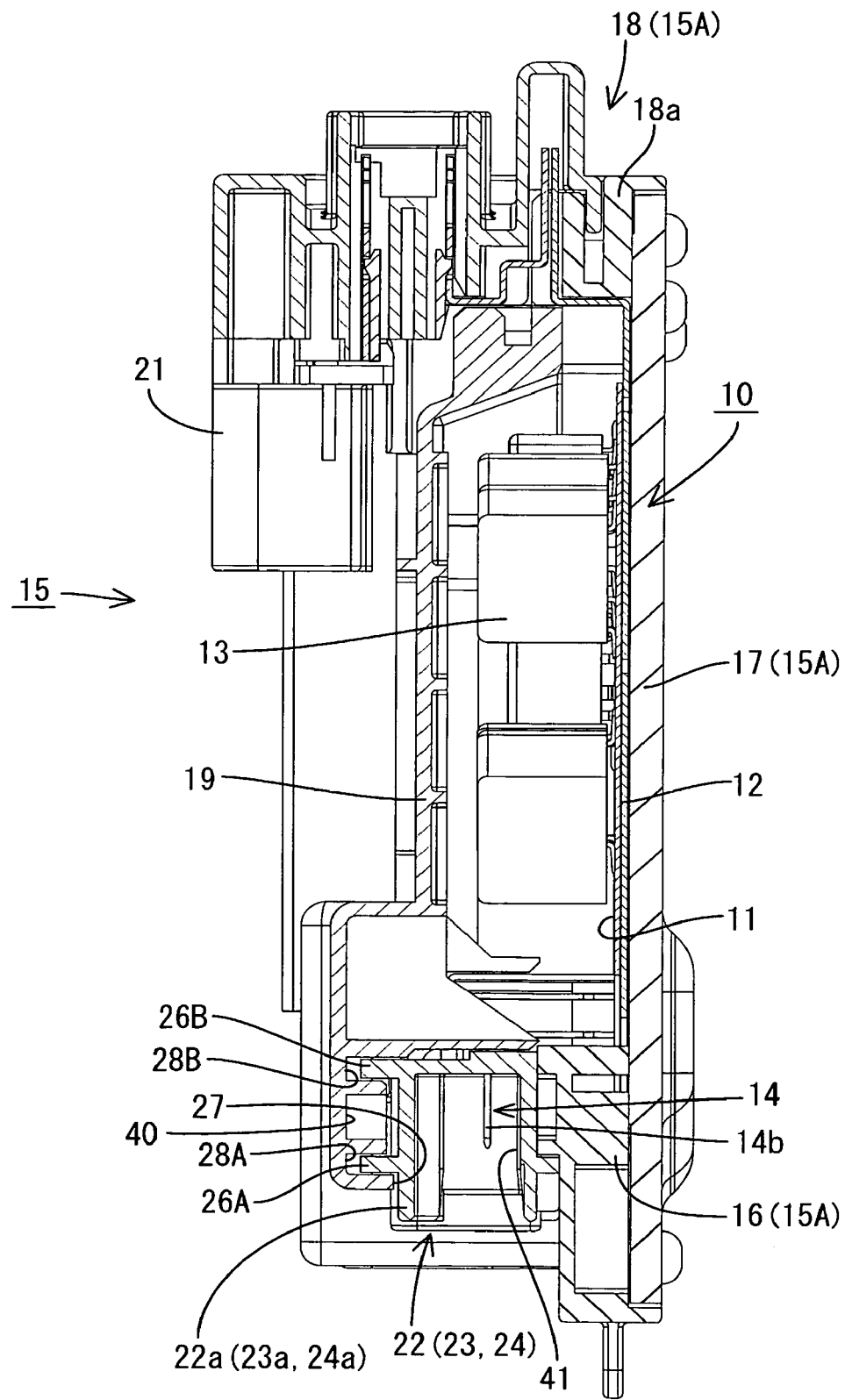
FIG. 3 is a sectional view of one aspect of the invention.

The present invention will now be described with reference to FIGS. 1 to 3. An electrical connection box, as described herein, may be mounted in an automobile, and is preferably configured to be positioned between a battery (not shown) and a vehicle-mounted electrical component (not shown) such as a lamp or an audio device. The electrical connection box distributes and supplies electric power supplied from the battery to each electrical component, and performs control of energization and deenergization of electric power. In FIGS. 1 and 2, the electrical connection box is shown with a front surface directed upward, but when mounted in the automobile, as shown in FIG. 3, the electrical connection box is housed in a relay box (not shown) with a fuse block 18 placed on an upper side and fitting opening portions 41 of connectors 21, 22, 23 and 24 opening downward, and the relay box can be secured to a vehicle body (not shown). In the following description, the vertical direction in FIG. 3 is used as the reference. The left side in FIG. 3 is a front side and the right side is a back side.

The electrical connection box includes a circuit component 10, and a case 15 that houses the circuit component 10.

The circuit component 10 includes a circuit board 11, a plurality of busbars 12 arranged along a back surface of the circuit board 11, and a switching member 13 such as a relay mounted to a front surface of the circuit board 11. The busbars 12 are bonded to the back surface of the circuit board 11, and terminal portions 14 are formed at lower ends of the busbars 12 so as to protrude from a lower edge of the circuit board 11. Each terminal portion 14 includes a support portion 14a rising toward the front surface substantially perpendicular to the circuit board 11, and a connecting portion 14b extending downward (opposite to the circuit board 11) from a rising end of the support portion 14a substantially perpendicularly to the support portion (substantially in parallel with the circuit board 11), and is shaped into a substantially L-shape seen from the side.

The case 15 includes a case main body 15A having one opening surface and formed into a flat shape, and a cover 19 that covers the opening surface of the case main body 15A. The case main body 15A includes a frame 16 made of insulation material such as synthetic resin and has a substantially square shape, a radiator plate 17 made of metal and secured to the frame 16 so as to block an opening in the back side thereof, and a fuse block 18 made of synthetic resin and assembled to the frame 16 from an upper edge thereof. The first connector 21, which can be made of synthetic resin, is assembled to the fuse block 18. Further, the second to fourth connectors 22, 23 and 24, which can be made of synthetic resin, are assembled to a lower edge of the frame 16.

The frame 16 is placed so as to continuously surround the entire periphery of the circuit component 10 along a peripheral edge of the circuit board 11. The frame 16 is secured to a front surface of the radiator plate 17 by an adhesive (not shown). The plurality of terminal portions 14 are arranged in a line along the lower edge of the frame 16.

The radiator plate 17 has a substantially similar shape to the circuit board 11, and back surfaces of the busbars 12 are secured to the front surface of the radiator plate 17 by an adhesive (not shown).

The fuse block 18 includes a laterally elongated main body 18a placed along the upper edge of the frame 16, and a pair of arm portions 18b cantilevered downward from laterally opposite ends of the main body 18a. The main body 18a houses complex terminals formed at upper ends of the busbars 12, terminal fittings, and a fuse (not shown).

The second connector 22, among the second to fourth connectors 22, 23 and 24 mounted to the lower edge of the frame 16, generally has a laterally elongated block shape, and has a connector housing 22a opening downward. The second connector 22 is placed on the front surface of the frame 16 and is secured by fastening mounting pieces 22b at laterally opposite ends to the front surface at the lower edge of the frame 16 by screws 25. The connecting portions 14b of the terminal portions 14 pass through a support wall of the second connector 22 and are housed in the connector housing 22a, thus function as terminal fittings. As a result, the second connector 22 and the circuit board 11 are electrically connected. An unshown harness connector (corresponding to a counterpart connector of the invention) fits in the connector housing 22a of the second connector 22 from a lower side. The third connector 23 and the fourth connector 24 also have connector housings 23a and 24a opening downward like the second connector 22, and are secured to the frame 16 by screws. The connector housings 22a, 23a and 24a of the connectors 22, 23 and 24 each include a front surface wall, right and left side walls, and a back surface wall. The back surface wall (the right wall in FIG. 3) abuts against the front surface at the lower edge of the frame 16.

From outer peripheral surfaces of the front surface wall and the right and left side walls of each of the connector housings 22a, 23a and 24a, first ribs 26A protrude, in that linear portions extend substantially perpendicular to an opening direction (downward and a fitting direction of a counterpart connector) of each of the connector housings 22a, 23a and 24a in the outer peripheral surfaces of the walls. The linear portions of the ribs 26A in the right and left side walls are connected to laterally opposite ends of the linear portion of the rib 26A in the front surface wall. The first rib 26A is placed in a slightly higher position than a lower edge (an opening edge) of each of the connector housings 22a, 23a and 24a.

From the outer peripheral surface of the front surface wall of each of the connector housings 22a, 23a and 24a, a second rib 26B protrudes, extending linearly and substantially perpendicular to the opening direction (downward and the fitting direction of the counterpart connector) of each of the connector housings 22a, 23a and 24a. The second rib 26B is formed along an upper edge of each of the connector housings 22a, 23a and 24a.

The cover 19 generally has a similar shape to the circuit board 11, and is slightly larger than the circuit board 11. The cover 19 is assembled to the frame 16 from the front surface. With the cover 19 assembled, the circuit board 11 and the switching member 13 housed in the frame 16 are covered with the cover 19.

With the cover 19 assembled to the frame 16, three opening portions 27 for housing the second to fourth connectors 22, 23 and 24 are formed between the lower edge of the cover 19 and the frame 16. Facing wall portions 40, which are at inner peripheral edges of the opening portions 27, are formed to face the outer peripheral surfaces of the second to fourth connector housings 22a, 23a and 24a. In each facing wall portion 40, a first rib receiving groove 28A that fits the first rib 26A and a linear second rib receiving groove 28B that fits the second rib 26B are vertically formed.

A space between a bottom of the first rib receiving groove 28A and a tip surface of the first rib 26A is larger than a space between a side surface of the first rib receiving groove 28A and a side surface of the first rib 26A in a vertical direction (the fitting direction of the counterpart connector). Similarly, a space between a bottom of the second rib receiving groove 28B and a tip surface of the second rib 26B is larger than a space between a side surface of the second rib receiving groove 28B and a side surface of the second rib 26B in the vertical direction (the fitting direction of the counterpart connector).

With the above described components assembled, the pair of upper and lower rib receiving grooves 28A and 28B in the cover 19 fit the ribs 26A and 26B of each of the connectors 22, 23 and 24 in gaps between the outer peripheral surfaces of the second to fourth connector housings 22a, 23a and 24a and the facing wall portions 40. The rib receiving grooves 28A and 28B and the ribs 26A and 26B extend substantially perpendicularly to a direction parallel to the opening direction (the fitting direction of the counterpart connector) of each of the connectors 22, 23 and 24, that is, a direction parallel to a direction from an outer periphery (a lower edge) to an inner periphery (an upper edge) at the lower edge of the frame 16. Thus, even if a liquid, such as water, directly falls on the case 15 and the cover 19 and nearly enters the case 15 from the lower side of the case 15 (the outside of the frame 16) through the clearances between the cover 19 and the connectors 22, 23 and 24, a shielding structure constituted by the ribs 26A and 26B and the rib receiving grooves 28A and 28B fitting to each other is formed in the clearances between the cover 19 and the connectors 22, 23 and 24, thereby preventing or limiting the liquid from entering the case 15.

Further, the two sets of ribs 26A and 26B and rib receiving grooves 28A and 28B are provided in a line from the outer periphery to the inner periphery of the of the frame 16 (a liquid entering direction from the outside to the inside of the case 15), thereby more reliably preventing or limiting the liquid from entering the frame 16 (the case 15).

In order to block an entering path of the liquid more reliably, it may be considered that the spaces between the ribs 26A and 26B and the rib receiving grooves 28A and 28B are as small as possible. With this method, however, there is a concern that capillarity causes the liquid to enter the case 19 through the gaps between the ribs 26A and 26B and the rib receiving grooves 28A and 28B.

In view of the above, in this aspect, the spaces between the bottoms of the rib receiving grooves 28A and 28B and the tip surfaces of the ribs 26A and 26B are larger than the spaces between the side surfaces of the rib receiving grooves 28A and 28B and the side surfaces of the ribs 26A and 26B in the vertical direction. Thus, the entering of the liquid caused by the capillarity is blocked in the gaps between the bottoms of the rib receiving grooves 28A and 28B and the tip surfaces of the ribs 26A and 26B, thereby reliably preventing the liquid from entering the case 15.

The present invention is not limited with respect to the above description and drawings, and as such the following aspects, for example, may also be included in the technical scope of the present invention.

As described previously, the connector is a component separate from the frame, but according to the present invention, the connector may be integrally formed with the frame.

As described previously, the ribs are provided in the connector, and the rib receiving grooves are provided in the covers, but according to the present invention, the rib receiving grooves may be provided in the connector, and the ribs may be provided in the cover, or the ribs and the rib receiving grooves may be formed in both the connector and the cover.

As described previously, the two sets of ribs and rib receiving grooves are provided in one connector, but according to the present invention, one set of rib and rib receiving groove or three or more sets of ribs and rib receiving grooves may be provided in one connector.

As described previously, the spaces between the bottoms of the rib receiving grooves 28A and 28B and the tip surfaces of the ribs 26A and 26B are larger than the spaces between the side surfaces of the rib receiving grooves 28A and 28B and the side surfaces of the ribs 26A and 26B in the vertical direction. However, as long as the entering of the liquid caused by the capillarity can be blocked, the spaces between the bottoms of the rib receiving grooves 28A and 28B and the tip surfaces of the ribs 26A and 26B may be smaller than the spaces between the side surfaces of the rib receiving groove 28A, 28B and the side surfaces of the ribs 26A and 26B in the vertical direction.

What is claimed is:

1. An electrical connection box comprising:
    a case having an opening portion;
    a circuit board positioned in said case;
    a connector including a connector housing, wherein the connected is assembled to said case so that the connector housing is positioned in said opening portion, and fittable to a counterpart connector;
    a facing wall portion formed in an inner peripheral edge of said opening portion in said case positioned to face an outer peripheral surface of said connector housing;
    a rib that protrudes from at least one of the outer peripheral surface of said connector housing and said facing wall portion of said case toward the other, and extends in a gap between the outer peripheral surface of said connector housing and said facing wall portion in a direction perpendicular to a fitting direction of said counterpart connector; and
    a rib receiving groove that is formed in the other of the outer peripheral surface of said connector housing and said facing wall portion, the rib receiving groove structured to receive the rib, wherein the rib includes a plurality of ribs and said rib receiving groove includes a plurality of rib receiving grooves, further wherein the plurality of ribs and rib receiving grooves are provided in a line in a fitting direction of said counterpart connector in the gap between the outer peripheral surface of said connector housing and said facing wall portion.

2. The electrical connection box according to claim 1, wherein the facing wall portion and an outer peripheral surface of the connector housing define a clearance.

3. The electrical connection box according to claim 1, wherein a space between a bottom of said rib receiving groove and a tip surface of said rib is larger than a space between a side surface of said rib receiving groove and a side surface of said rib in the fitting direction of said counterpart connector.

4. The electrical connection box according to claim 1, wherein said case includes a case main body having one opening surface and formed into a flat shape, and a cover that covers the opening surface of the case main body, and wherein the facing wall portion is formed in the cover.

5. The electrical connection box according to claim 1, wherein said opening portion is provided in a lower surface of said case, and said connector housing is assembled with a fitting opening portion of the connector housing directed downward.

6. The electrical connection box according to claim 1, wherein said connector is electrically connected to said circuit board.

7. The electrical connection box according to claim 1, wherein a plurality of busbars are positioned in said circuit board, and tips of said busbars are positioned in said connector housing to function as terminal fittings.

8. The electrical connection box according to claim 1, wherein said case is vertically positioned so that a plate surface of said circuit board positioned in said case is substantially vertically positioned.

9. The electrical connection box according to claim 1, wherein said electrical connection box is mounted in a vehicle and controls energization and deenergization of a vehicle-mounted electrical component.

10. The electrical connection box according to claim 2, wherein a space between a bottom of said rib receiving groove and a tip surface of said rib is larger than a space between a side surface of said rib receiving groove and a side surface of said rib in the fitting direction of said counterpart connector.

11. The electrical connection box according to claim 10, wherein said case includes a case main body having one opening surface and formed into a flat shape, and a cover that covers the opening surface of the case main body, further wherein the facing wall portion is formed in the cover.

12. The electrical connection box according to claim 11, wherein said opening portion is positioned in a lower surface of said case, and said connector housing includes a fitting opening portion of the connector housing directed downward.

13. The electrical connection box according to claim 12, wherein said connector is electrically connected to said circuit board.

14. The electrical connection box according to claim 12, wherein a plurality of busbars are positioned in said circuit board, and tips of said busbars are positioned in said connector housing to function as terminal fittings.

15. The electrical connection box according to claim 12, wherein said case is vertically positioned so that a plate surface of said circuit board positioned in said case is substantially vertically positioned.

16. The electrical connection box according to claim 12, wherein said electrical connection box is mounted in a vehicle and controls energization and deenergization of a vehicle-mounted electrical component.

17. The electrical connection box according to claim 13, wherein a plurality of busbars are positioned in said circuit board, and tips of said busbars are positioned in said connector housing to function as terminal fittings.

18. The electrical connection box according to claim 17, wherein said case is vertically positioned so that a plate surface of said circuit board positioned in said case is substantially vertically positioned.

19. The electrical connection box according to claim 18, wherein said electrical connection box is mounted in a vehicle and controls energization and deenergization of a vehicle-mounted electrical component.

* * * * *